(12) United States Patent
Son et al.

(10) Patent No.: US 9,582,125 B2
(45) Date of Patent: Feb. 28, 2017

(54) PROJECTED CAPACITIVE TOUCH SENSOR WITH ASYMMETRIC BRIDGE PATTERN FIELD

(71) Applicant: Elo Touch Solutions, Inc., Milpitas, CA (US)

(72) Inventors: Kyu-Tak Son, Mountain View, CA (US); Joel C. Kent, Fremont, CA (US)

(73) Assignee: ELO TOUCH SOLUTIONS, INC., Milpitas, CA (US)

( * ) Notice: Subject to any disclaimer, the term of this patent is extended or adjusted under 35 U.S.C. 154(b) by 142 days.

(21) Appl. No.: 14/395,295

(22) PCT Filed: Apr. 17, 2013

(86) PCT No.: PCT/US2013/036868
§ 371 (c)(1),
(2) Date: Oct. 17, 2014

(87) PCT Pub. No.: WO2013/158699
PCT Pub. Date: Oct. 24, 2013

(65) Prior Publication Data
US 2015/0138137 A1  May 21, 2015

Related U.S. Application Data

(63) Continuation of application No. 13/451,253, filed on Apr. 19, 2012, now Pat. No. 9,197,208.
(Continued)

(51) Int. Cl.
*G06F 3/041* (2006.01)
*G06F 3/045* (2006.01)
(Continued)

(52) U.S. Cl.
CPC ......... *G06F 3/044* (2013.01); *H03K 17/9622* (2013.01); *G06F 2203/04103* (2013.01);
(Continued)

(58) Field of Classification Search
CPC .......... G06F 3/044; G06F 2203/041111; G06F 2203/04103
(Continued)

(56) References Cited

U.S. PATENT DOCUMENTS 4,550,221 A   10/1985   Mabusth
4,639,720 A   1/1987    Rympalski et al.
(Continued)

FOREIGN PATENT DOCUMENTS

CN   101699384 A   4/2010
CN   201773378 U   3/2011
(Continued)

OTHER PUBLICATIONS

English-language abstract of Taiwanese Patent Application Publication No. 201101158A; 2 pages.
(Continued)

*Primary Examiner* — Temesghen Ghebretinsae
*Assistant Examiner* — Benyam Ketema
(74) *Attorney, Agent, or Firm* — Sterne, Kessler, Goldstein and Fox P.L.L.C.

(57) ABSTRACT

A capacitive touch sensitive device includes a matrix of pads patterned in a first electrically conductive material on a substrate. Horizontally adjacent pads within each even row of the matrix are electrically coupled to one another via channels to form a plurality of horizontally arranged electrodes. Insulators are positioned over respective channels. Conductive links are formed over respective insulators and are configured to electrically couple vertically adjacent pads between odd rows of the matrix to form a plurality of vertically arranged electrodes. The dimensions of the channels and the conductive links are configured such that an RC time-constant (RCtc) of each of the vertically arranged
(Continued)

electrodes substantially matches an RCtc of each of the horizontally arranged electrodes.

16 Claims, 5 Drawing Sheets

Related U.S. Application Data

(60) Provisional application No. 61/784,517, filed on Mar. 14, 2013.

(51) Int. Cl.
 *G06F 3/044* (2006.01)
 *H03K 17/96* (2006.01)
(52) U.S. Cl.
 CPC ............ *G06F 2203/04111* (2013.01); *Y10T 29/49155* (2015.01)
(58) Field of Classification Search
 USPC .................................................. 345/173, 174
 See application file for complete search history.

(56) References Cited

U.S. PATENT DOCUMENTS

| | | | |
|---|---|---|---|
| 5,543,590 A | 8/1996 | Gillespie et al. | |
| 5,844,506 A | 12/1998 | Binstead | |
| 7,463,246 B2 | 12/2008 | Mackey | |
| 8,593,410 B2 | 11/2013 | Hong et al. | |
| 8,988,383 B2* | 3/2015 | Kim ........................ | G06F 3/044 345/173 |
| 9,197,208 B2 | 11/2015 | Son | |
| 2005/0030048 A1* | 2/2005 | Bolender .............. | G06F 3/0202 324/661 |
| 2007/0229470 A1* | 10/2007 | Snyder ................... | G06F 3/011 345/173 |
| 2008/0264699 A1* | 10/2008 | Chang ..................... | G06F 3/044 178/18.01 |
| 2008/0297174 A1 | 12/2008 | Narasimhan et al. | |
| 2008/0314626 A1* | 12/2008 | Moore .................. | G06F 3/0412 174/255 |
| 2009/0160682 A1* | 6/2009 | Bolender .............. | G06F 3/0202 341/33 |
| 2009/0194344 A1 | 8/2009 | Harley et al. | |
| 2009/0314105 A1* | 12/2009 | Dattalo ................ | G01D 5/2405 73/862.626 |
| 2009/0322704 A1* | 12/2009 | Anno ...................... | G06F 3/044 345/174 |
| 2010/0123674 A1* | 5/2010 | Wu ......................... | G06F 3/044 345/173 |
| 2010/0156810 A1 | 6/2010 | Barbier et al. | |
| 2010/0164900 A1 | 7/2010 | Lin | |
| 2010/0207891 A1 | 8/2010 | Wang | |
| 2010/0302201 A1 | 12/2010 | Ritter et al. | |
| 2010/0321328 A1 | 12/2010 | Chang et al. | |
| 2011/0007020 A1 | 1/2011 | Hong et al. | |
| 2011/0139516 A1 | 6/2011 | Nirmal et al. | |
| 2012/0013564 A1 | 1/2012 | Westhues et al. | |
| 2012/0019473 A1* | 1/2012 | Edwards ................ | G06F 3/044 345/174 |
| 2012/0044197 A1 | 2/2012 | Polishchuk et al. | |
| 2012/0044198 A1 | 2/2012 | Chai et al. | |
| 2012/0118614 A1* | 5/2012 | Kuriki ..................... | G06F 3/044 174/250 |
| 2013/0277193 A1 | 10/2013 | Son | |
| 2013/0321341 A1 | 12/2013 | Takahama | |
| 2015/0363025 A1 | 12/2015 | Son | |

FOREIGN PATENT DOCUMENTS

| | | |
|---|---|---|
| TW | 201101158 A | 1/2011 |
| TW | 201120718 A | 6/2011 |
| TW | 201310312 A | 3/2013 |

OTHER PUBLICATIONS

English-language abstract of Taiwanese Patent Application Publication No. 201120718A; 1 page.
English-language abstract of Taiwanese Patent Application Publication No. 201310312A; 1 page.
International Search Report and Written Opinion for International Application No. PCT/US2013/036868, European Patent Office, Netherlands, mailed on Jul. 3, 2013, 12 pages.
Office Action directed to related Taiwanese Patent Application No. 10420110092001, mailed Aug. 19, 2015, with English-language translation; 9 pages.
English-language abstract of Chinese Patent Application Publication No. 101699384 A, published Apr. 28, 2010; 1 page.
English-language abstract of Chinese Patent Application Pubication No. 201773378 U, published Mar. 23, 2011; 1 page.

* cited by examiner

PROJECTED CAPACITIVE TOUCH SENSOR WITH ASYMMETRIC BRIDGE PATTERN

FIELD

The subject matter disclosed herein relates generally to capacitive touch sensors, and more particularly to a projected capacitive touch sensor with an asymmetric bridge pattern.

BACKGROUND

Projected capacitive touch sensors typically include a substrate upon which sensing electrodes are disposed. The substrate may be a durable glass having high optical transparency for viewing images displayed by an underlying display device that displays images such as graphical buttons and icons. When a user touches the outer surface of the substrate at a location corresponding to a desired selection displayed on the display device, the location is determined by sensing a change in the capacitance of the sensing electrodes.

In some projected capacitive touch sensors, the sensing electrodes are arranged in rows and columns. The rows and columns comprise pads that are generally arranged in the form of a matrix. Horizontally adjacent pads in a given row of the matrix are connected together to form a single horizontally arranged electrode. Although, in some projected capacitive touch sensors, the horizontally arranged electrodes may be split so that they do not span the entire sensor. Likewise, vertically adjacent pads in a given column are connected together to form a single vertically arranged electrode, and vertical electrodes like horizontal electrodes optionally may be split.

Typically commercial projected capacitive touch sensor products are constructed from a lamination of at least two layers of glass in which horizontal electrodes and vertical electrodes are on different glass surfaces. For example, horizontal electrodes may be on one surface of a glass layer and the vertical electrodes on the opposite surface of the same glass layer. Alternatively horizontal and vertical electrodes may be fabricated on different glass layers. In either case, there is manufacturing cost associated with lamination of more than one piece of glass and with the fabrication of electrodes on more than one surface. Alternate designs in which both horizontal and vertical electrodes are fabricated on only one glass surface promise reduced manufacturing cost, particularly if the projected capacitive touch sensor includes only one glass layer with no lamination.

To facilitate both horizontally arranged and vertically arranged electrodes on a single surface, bridging connections may be utilized to connect adjacent pads of a given electrode orientation. For example, bridging connections may couple the vertically adjacent pads that form the vertically arranged electrodes. Known bridging connections have a substantially square geometry. That is, the width and height of the bridge connections are the same.

Associated with each electrode is resistance and capacitance, both of which depend on the size of the touch sensor. As the linear dimensions, of the touch sensor increase, so do the resistances and capacitances associated with the electrodes. The resulting resistor-capacitor time constant (RCtc) representative of electronic settling times of the touch sensor tend to grow quadradically with touch sensor size as both resistance and capacitance grow linearly. For small projected capacitive touch sensors used in smart phones or tablet computers, electronic settling times are less of an issue. However, for touch sensors designed for 15" diagonal displays and larger displays, long touch sensor electronic settling times become more problematic.

One problem with such large projected capacitive touch sensors is that the resistor-capacitor time constant (RCtc) of the horizontally and vertically arranged electrodes tends to be high and do not match. For example, a typical RCtc for such a large projected capacitive touch sensor may be 9 μs or higher. This is especially problematic when used in conjunction with fixed drive frequency controllers in which the total scan time is determined by the maximum RCtc of the arranged electrodes. The higher the RCtc, the more time that is needed to sense a capacitance value of the electrode. This in turn impacts the rate at which a touch location can be determined, which may negatively impact user experience.

Electronics may read-out projected capacitive touch sensitive devices in either self-capacitive mode, mutual-capacitive, or a mixed mode, which is combination of the two. In self-capacitive mode, electronics measure one capacitance per electrode. In mutual capacitance mode, or all-points-addressable (APA) mode, electronics measure capacitance between a row electrode and a column electrode. In either case, the capacitance changes when a finger approaches the electrode. The same projected capacitive touch sensor construction may support self-capacitive mode, mutual-capacitive mode, and mixed mode electronic read out.

SUMMARY

In a first aspect of an embodiment of the invention, a capacitive touch sensitive device includes a matrix of pads patterned in a first electrically conductive material on a substrate. Horizontally adjacent pads within each even row of the matrix are electrically coupled to one another via channels to form a plurality of horizontally arranged electrodes. Insulators are positioned over respective channels. Conductive links are formed over respective insulators and are configured to electrically couple vertically adjacent pads between odd rows of the matrix to form a plurality of vertically arranged electrodes. The dimensions of the channels and the conductive links are configured such that an RCtc of each of the vertically arranged electrodes substantially matches an RCtc of each of the horizontally arranged electrodes. The dimensions of channels and conductive links may not be constant, but locally vary within the touch area. That is, different channels and links may have varying dimensions.

In a second aspect of an embodiment of the invention, a method of manufacturing a capacitive touch sensitive device includes patterning a matrix of pads in a first electrically conductive material on a substrate. Horizontally adjacent pads within each even row of the matrix are electrically coupled to one another via channels to form a plurality of horizontally arranged electrodes. The method also includes forming insulators over respective channels from an insulator and forming conductive links over respective insulators configured to electrically couple vertically adjacent pads between odd rows of the matrix to form a plurality of vertically arranged electrodes. The dimensions of the channels and the conductive links are configured such that an RCtc of each of the vertically arranged electrodes substantially matches an RCtc of each of the horizontally arranged electrodes. The dimensions of channels and conductive links may not be configured as constant dimensions, but may be configured to locally vary within the touch area. That is, different channels and links may be configured with varying dimensions.

In a third aspect of an embodiment of the invention, a capacitive touch sensitive device includes a matrix of pads patterned in a first electrically conductive material on a substrate. Horizontally adjacent pads within each even row of the matrix are electrically coupled to one another via channels to form a plurality of horizontally arranged electrodes. Insulators are positioned over respective channels. Conductive links are formed over respective insulators and are configured to electrically couple vertically adjacent pads between odd rows of the matrix to form a plurality of vertically arranged electrodes. The dimensions of the channels and the conductive links are configured such that an RCtc of each of the vertically arranged electrodes substantially matches an RCtc of each of the horizontally arranged electrodes. The total number of vertically arranged electrodes may be different than a total number of horizontally arranged electrodes, and the RCtc of each of the vertically arranged electrodes and the horizontally arranged electrodes may be less than 6.5 µs and is within ±50% of each other. The dimensions of channels and conductive links may not be constant, but locally vary within the touch area. That is, different channels and links may have varying dimensions.

BRIEF DESCRIPTION OF THE DRAWINGS

The accompanying drawings are included to provide a further understanding of the claims, are incorporated in, and constitute a part of this specification. The detailed description and illustrated embodiments described serve to explain the principles defined by the claims.

DETAILED DESCRIPTION

Embodiments will be described more fully hereinafter with reference to the accompanying drawings, in which some, but not all embodiments contemplated herein are shown. Indeed, various embodiments may be implemented in many different forms and should not be construed as limited to the embodiments set forth herein; rather, these embodiments are provided so that this disclosure will satisfy applicable legal requirements. Like numbers refer to like elements throughout.

The embodiments described below overcome the problems discussed above by utilizing connections with asymmetric elements to couple the pads of the horizontally and vertically arranged electrodes.

Figure 1:
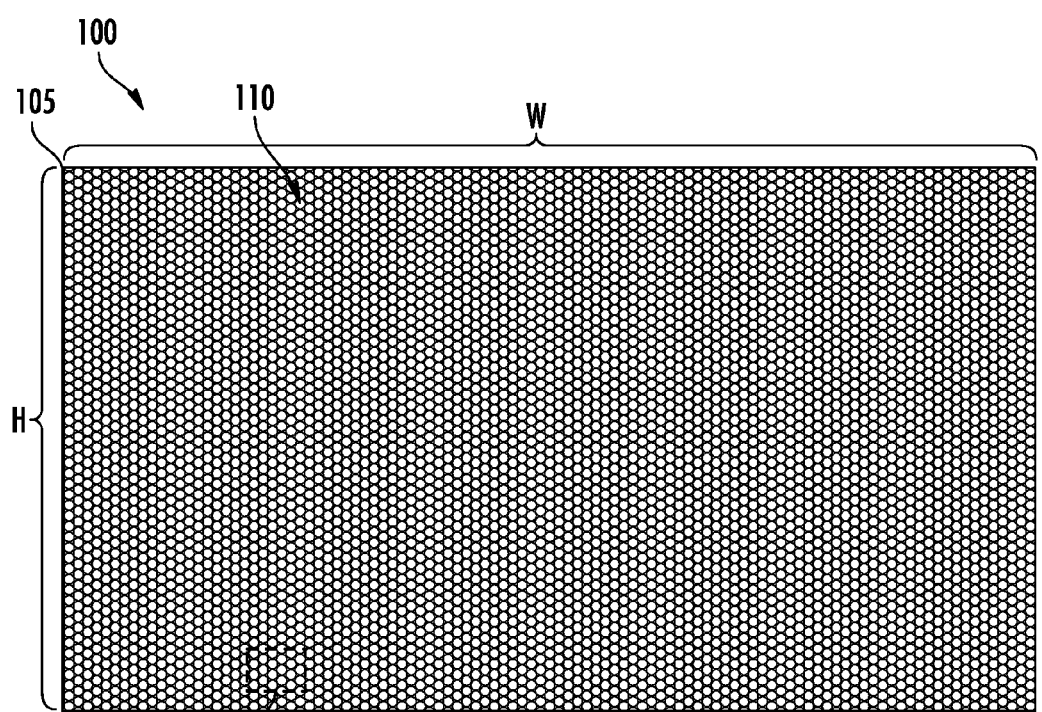
FIG. 1 illustrates a capacitive touch sensitive device.

FIG. 1 illustrates capacitive touch sensitive device 100. The device 100 includes a substrate 105 upon which an electrode matrix 110 is arranged. The electrode matrix 110 includes a group of horizontally arranged electrodes and vertically arranged electrodes. In one exemplary embodiment, to accommodate a 16:9 display aspect ratio, the horizontally and vertically arranged electrodes fit within a rectangular area of the substrate that has a width, W, of about 477 mm and a height, H, of about 270 mm. Sixty-four vertically arranged electrodes and thirty-six horizontally arranged electrodes may be positioned within that area. In other words, the ratio of the number of vertically arranged electrodes to horizontally arranged electrodes may be about a 16:9. It is understood, however, that the principles disclosed herein may be adapted to accommodate different display sizes and a different number of horizontally and vertically arranged electrodes.

Figure 2:
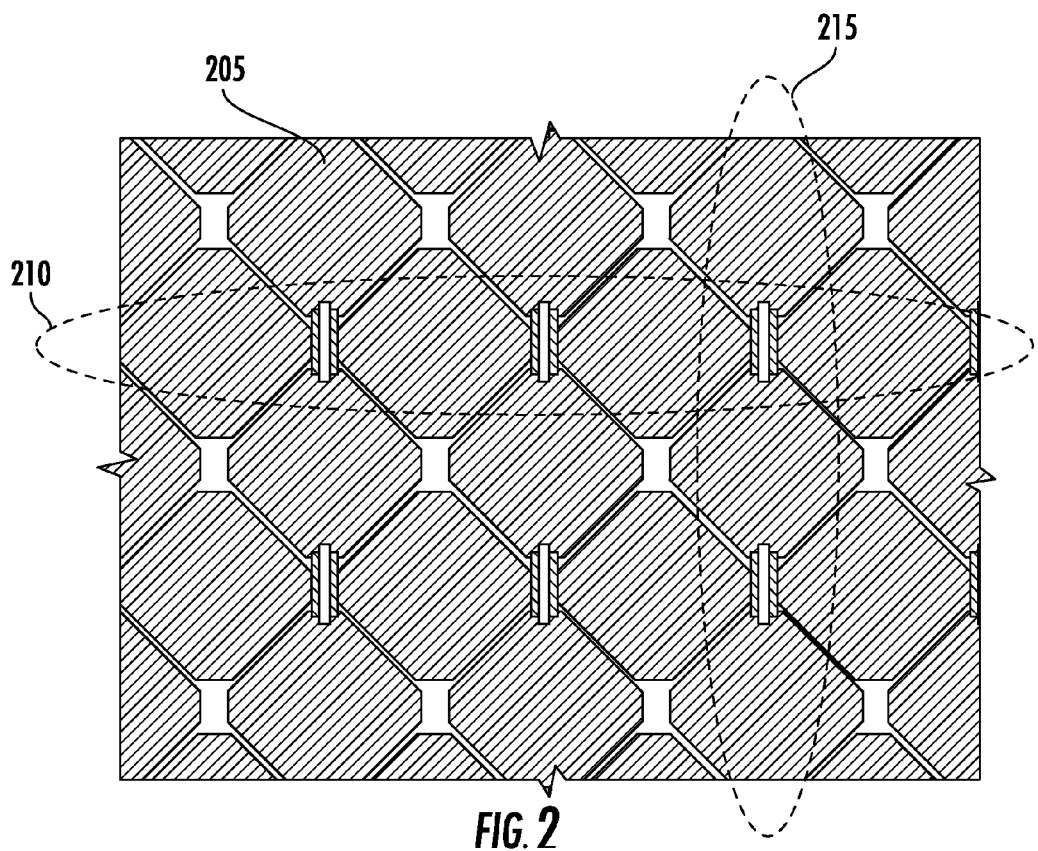
FIG. 2 illustrates details of a portion of an electrode matrix of the capacitive touch sensitive device.

FIG. 2 illustrates details of a portion of the electrode matrix 110. The matrix 110 is generally composed of a group of pads 205 arranged in rows and columns. In one exemplary embodiment, each pad 205 has a generally diamond shape and has an area of about 18 mm². The pads 205 may be patterned by etching an electrically conductive material layer previously deposited on a surface of the substrate 105, such as indium-tin-oxide (ITO). The sheet resistance of the electrically conductive material layer may be about 150 Ω/sq. However, different conductive materials may be used, and the pads 205 may be patterned differently and/or have a different shape.

In one implementation, horizontally adjacent pads 205 within every other row 210 (e.g., even rows) of the matrix 110 are electrically coupled to one another to collectively form horizontally arranged electrodes 210 that span substantially the entire width, W, of the capacitive touch sensitive device 100. In other implementations, a given row may include multiple horizontally arranged electrodes that each group a subset of the pads in the row, for example a horizontal row may be split into left and right electrodes. Pads 205 in the other rows (e.g., odd rows) are coupled to one another column-wise to collectively form vertically arranged electrodes 215 that span substantially the entire height, H, of the capacitive touch sensitive device 100. The horizontally arranged electrodes 210 are utilized to determine the vertical coordinate of a touch. The vertically arranged electrodes 215 are utilized to determine the horizontal coordinate of the touch.

Figure 3A:
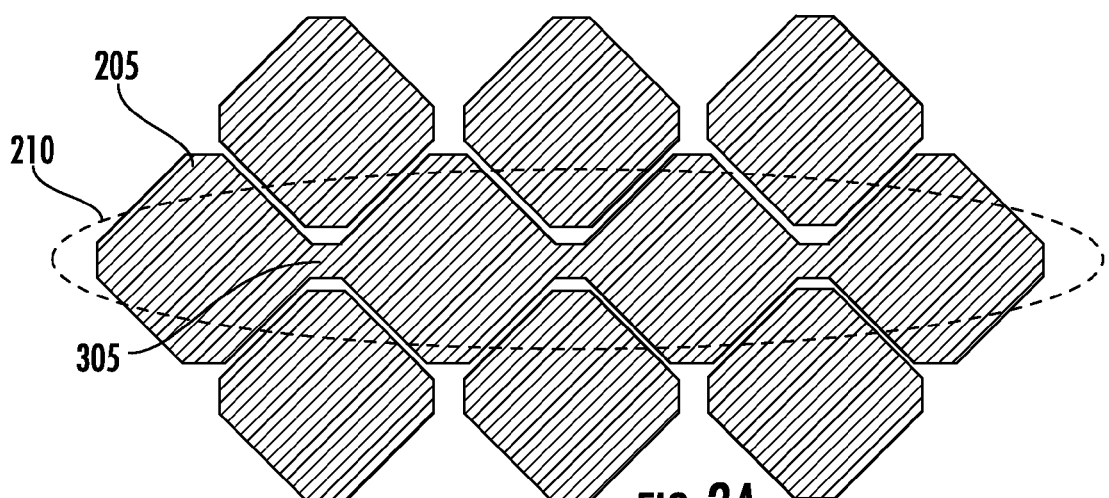
FIGS. 3A-3C illustrate different elements of the electrode matrix that facilitate coupling of pads of the matrix to form horizontally and vertically arranged electrodes.
Figure 3B:
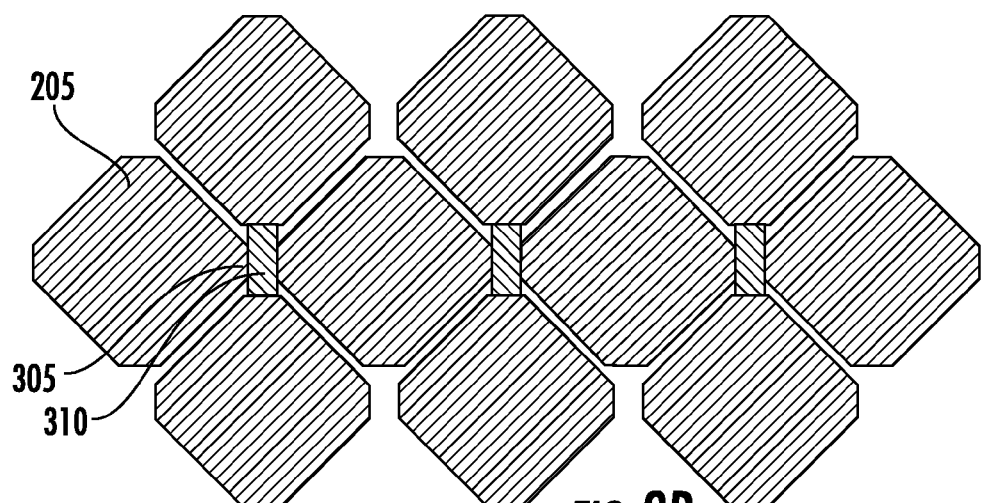
Figure 3C:
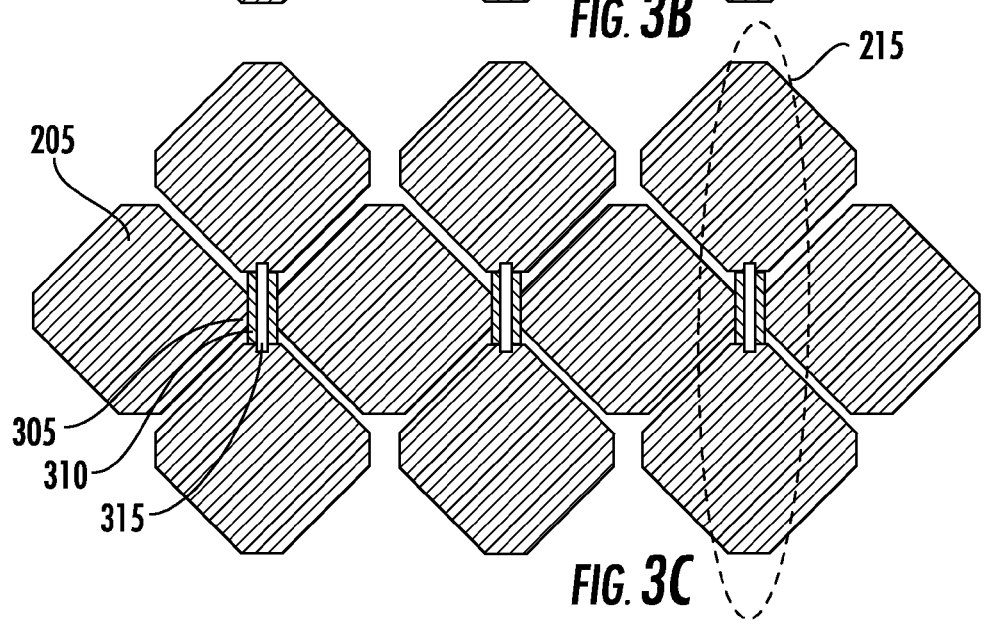

FIGS. 3A-3C illustrate different elements of the matrix 100 that facilitate coupling of the pads 205 to form the horizontally and vertically arranged electrodes (210, 215). Referring to FIG. 3A, channels 305 couple the horizontally adjacent pads 205 of the horizontally arranged electrode 210. The channels 305 may be formed from the same electrically conductive material layer used to form the pads 205 and may be patterned at the same time as the pads 205. For example, an electrically conductive material may be uniformly deposited on the substrate 105. A mask that defines the pattern of FIG. 3A may be used to selectively remove unwanted conductive material to define the pattern of FIG. 3A.

Referring to FIG. 3B, insulators 310 may be formed over the channels 305, and in FIG. 3C, links 315 made of a conductive material may be deposited over the insulators 310 to couple vertically adjacent pads 205 of the vertically arranged electrodes 215. The insulators 310 may be formed from an insulating material such as a polymer or ceramic.

For example, glass paste part number NP-7770B1 from Noritake Corp. or ceramic part number G3-5679 from Okuno Corp. may be utilized for the insulating material.

The insulators are sized to prevent a short circuit between the links 315 and the channels 305 below, even when there are reasonable registration tolerances or errors during manufacture. That is, the insulators 310 may be slightly larger than the portion of the channels 305 over which the links 315 are deposited. The links 315 may be formed from the same transparent conductive material used to form the pads 205 or a different material. In one exemplary embodiment, the links 315 are formed from a conductive material with a sheet resistance of about 200 Ω/sq.

Figure 4A:
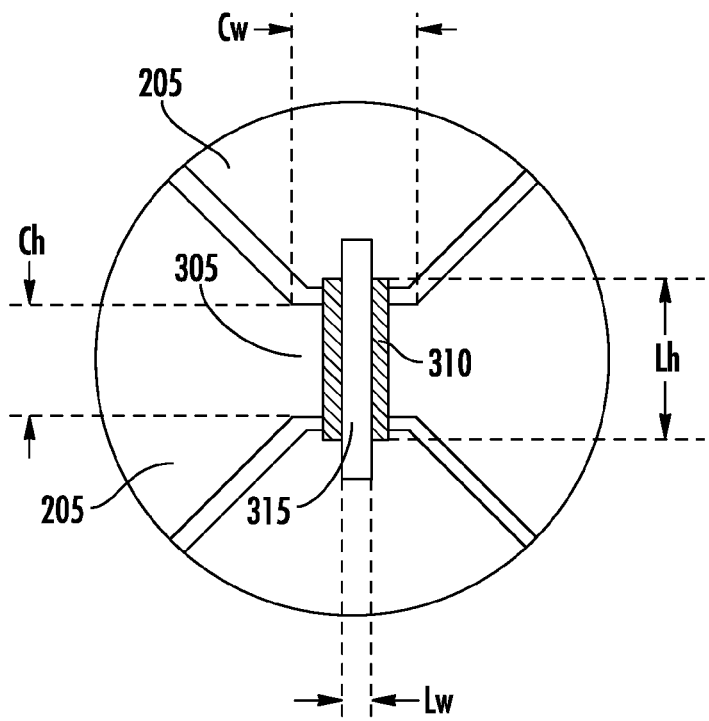
FIG. 4A illustrates various dimensions of channels and links that couple adjacent pads that may be adjusted according to various embodiments.

FIG. 4A illustrates various dimensions (Cw, Ch, Lw, and Lh) of the channel 305 and link 315 that may be adjusted according to various embodiments. Typical channels and links are patterned to overlap and have a generally square geometry with matching surface area sizes. That is, dimension Lw and Ch may match, and dimensions Lh and Cw may match. Applicant has observed that the RCtc associated with the horizontally and vertically arranged electrodes can be varied somewhat by adjusting the sizes of the channels and links.

Table 1 summarizes the results of various RCtc simulation results associated with electrode sensor matrices with different channel and link dimensions. In conventional designs, each of the electrode sensor matrices utilizes a diamond-shape pad with a surface area of about 18 mm². Sixty-four pads are arranged within each horizontally arranged electrode, and thirty-six pads are arranged within each vertically arranged electrode. The RCtc associated with the horizontally arranged electrode is larger than the RCtc associated with the vertically arranged electrode due to its increased length and, therefore, represents a worst-case RCtc of the matrix. Only horizontal electrode RCtc values are shown in Table 1. The RCtc of an electrode may be determined from the resistance per pad, R, and number of pads per electrode, n, and effective capacitance per pad, C, of the electrode which, in this case, is the horizontally arranged electrode. The resistance, R, may be determined by dividing the total electrode resistance by the number of pads in the electrode. The effective capacitance, C, corresponds to coupling capacitance between a given pad and its neighboring pads and to ground. The resistor-capacitor time constant associated with an electrode with n pads is given by $RCtc=(nR)\cdot(nC)=n^2RC$.

As shown, the electrode sensor matrix that utilizes channels and links with respective widths and height (Cw, Ch, Lw, and Lh) of about 0.4 mm has the lowest horizontal RCtc, which was determined to be 8.96 μs.

TABLE 1

| | Size (Lw × Ch) (mm) | | | | |
|---|---|---|---|---|---|
| | 1.0 × 1.0 | 0.5 × 0.5 | 0.4 × 0.4 | 0.3 × 0.3 | 0.2 × 0.2 |
| R (Ω) | 540 | 676 | 732 | 810 | 934 |
| C (pF) | 6 | 3.32 | 2.99 | 2.72 | 2.51 |
| Horizontal RCtc (μs) | 13.27 | 9.19 | 8.96 | 9.02 | 9.6 |

Table 2 summarizes the results when asymmetric shapes are utilized for the channels 305 and links 315 instead of square shapes. For asymmetric shapes, it was observed that the worst case RCtc was not always associated with the longer electrode axis (i.e., horizontally arranged electrode). Therefore, the RCtc of both the horizontally and vertically arranged electrodes were measured for various dimensional combinations of the channels 305 and links 315. As shown, the lowest overall RCtc is associated with a channel with a width, Cw, of 0.4 mm and a height, Ch, of 1.0 mm, and a link with a width, Lw, of 0.2 mm and height, Lh, of 1.2 mm. The worst-case RCtc is 6.04 μs and is associated with the horizontally arranged electrode. The RCtc for the horizontally and vertically arranged electrodes are within ±50% of each other, and preferably ±10%, and more preferably ±2% of each other. That is, the RCtc of the respective sensors essentially match.

TABLE 2

| | Channel (Cw × Ch) | | | | | | | |
|---|---|---|---|---|---|---|---|---|
| | 0.4 × 0.6 | 1.0 × 1.0 | 1.0 × 1.1 | 1.0 × 0.9 | 0.4 × 0.9 | 0.4 × 0.8 | 0.4 × 1.0 | 0.4 × 1.1 |
| | Link (Lw × Lh) (mm) | | | | | | | |
| | 0.4 × 0.6 | 0.2 × 1.2 | 0.2 × 1.3 | 0.2 × 1.1 | 0.2 × 1.1 | 0.2 × 1.0 | 0.2 × 1.2 | 0.2 × 1.3 |
| | Horizontal | | | | | | | |
| R (Ω) | 732 | 521 | 493 | 553 | 482 | 510 | 459 | 439 |
| C (pF) | 2.99 | 2.99 | 3.17 | 2.91 | 3.11 | 3.03 | 3.21 | 3.26 |
| RCtc (μs) | 8.96 | 6.38 | 6.40 | 6.59 | 6.14 | 6.33 | 6.04 | 5.86 |
| | Vertical | | | | | | | |
| R (Ω) | 732 | 1515 | 1583 | 1447 | 1447 | 1379 | 1515 | 1583 |
| C (pF) | 2.99 | 2.87 | 3.03 | 2.76 | 2.95 | 2.90 | 3.04 | 3.06 |
| RCtc (μs) | 2.94 | 5.63 | 6.21 | 5.18 | 5.53 | 5.18 | 5.97 | 6.28 |

The sheet resistance of the material used to form the channels 305 and links 315 was assumed to be the same for the matrices determined above. For example, the channels 305 and links 315 were assumed to have a sheet resistance of 150 Ω/sq. However, this may not always be practical. In some exemplary embodiments, the materials used to pattern the channels 305 and the links 315 are different. The sheet resistance of the material used to pattern the links 315 may, for example, be 200 Ω/sq.

Table 3 summarizes the results when such a material is used for the links 315. The channels and links of the matrices were arranged as described earlier. The combination with the lowest overall RCtc is represented in the fourth column. In this case, the channel 305 has a width, Cw, of 0.4 mm and height, Ch, of 1.1 mm. The link 315 has a width, Lw, of 0.2 mm and height, Lh, of 1.3 mm. The worst-case RCtc is 6.28 μs and is associated with the vertically arranged electrode.

TABLE 3

| Channel (Cw × Ch) | 0.4 × 0.9 | 0.4 × 0.8 | 0.4 × 1.0 | 0.4 × 1.1 |
|---|---|---|---|---|
| Link (Lw × Lh) (mm) | 0.2 × 1.1 | 0.2 × 1.0 | 0.2 × 1.2 | 0.2 × 1.3 |
| Horizontal | | | | |
| R (Ω) | 482 | 510 | 479 | 457 |
| C (pF) | 3.11 | 3.03 | 3.21 | 3.26 |
| RCtc (µs) | 6.14 | 6.33 | 6.30 | 6.10 |
| Vertical | | | | |
| R (Ω) | 1723 | 1630 | 1515 | 1583 |
| C (pF) | 2.95 | 2.90 | 3.04 | 3.06 |
| RCtc (µs) | 6.59 | 6.13 | 5.97 | 6.28 |

Figure 4B:
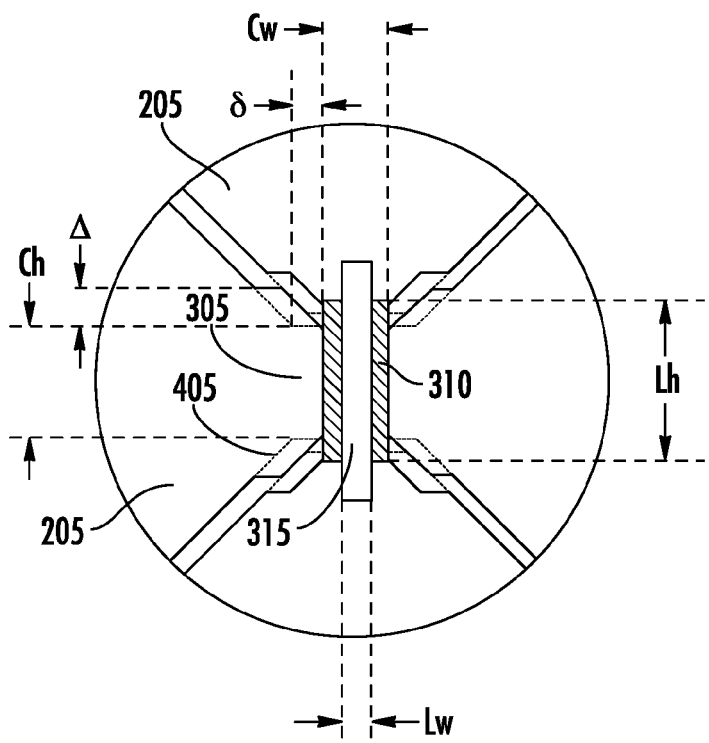
FIG. 4B illustrates an alternative channel geometry that facilities in the reduction of resistance along a horizontally arranged electrode.

FIG. 4B shows an alternate channel geometry that is possible when the link width, Lw, is substantially narrower than the channel width, Cw, as is the case with for the channel of FIG. 4A. The modified channel geometry facilitates the reduction of channel resistance and, therefore, a reduction in the RCtc for the horizontally arranged electrodes, by gradually narrowing the channel height, Ch, of the horizontally arranged electrode as approaches the edge of the insulator 310. The dashed lines 405 in FIG. 4B represents the geometry of the gap between vertical and horizontally arranged electrodes in FIG. 4A and are shown to illustrate the difference between the channel geometries of FIGS. 4A and 4B. The channel geometry of FIG. 4B reduces the current path length for which the channel is most constricted. The channel width Cw for the design of FIG. 4B is smaller than the channel width Cw of FIG. 4A by an amount of 2δ where δ is the length of the horizontal kink in the electrode boundaries as shown in FIG. 4B. Representative values of δ are in the range from 100 microns to 400 microns with 200 microns being a typical value. The height of the horizontal electrode at the kink of length δ is greater than the channel height Ch by an amount 2Δ where Δ is the vertical offset of the kink relative to the channel boundaries as shown in FIG. 4B. To receive the full benefit of the shortened channel width Cw, it is desirable that the kink vertical offset Δ is larger than the kink length δ. Representative values of the kink vertical offset Δ are in the range from 300 microns to 1,200 microns with 600 microns being a typical value. Corners in the electrode boundaries can be rounded and smoothed and the design will still provide substantially the same benefits. The essential feature of the design of FIG. 4B is a modified electrode boundary geometry in which the channel width Cw is reduced in a way that reduces the horizontal electrode resistance while to a good engineering approximation retaining a similar area and geometry of the diamond shaped pads that compose the electrodes. This, in turn, reduces the horizontal electrode resistance and hence RCtc while having substantially no effect on vertical electrode resistance of RCtc.

For projected capacitive touch sensors that are read out in self-capacitance mode, the horizontal electrode read out speed (more particularly the excitation drive frequency) is limited by the horizontal RCtc and the vertical electrode read out speed is limited by the vertical RCtc. If the same read out speed is used for both vertical and horizontal electrodes in self-capacitance mode, there is a clear advantage to minimizing the larger or worst-case of the horizontal and vertical RCtc values. For projected capacitive touch screen that are read out in mutual-capacitance mode, the horizontal and vertical RCtc values contribute to a mutual-capacitance settling time that limits the read out speed of mutual capacitances. While the mathematical details of how horizontal and vertical RCtc values combine for mutual capacitance readout is complex, it is still of benefit to balance horizontal and vertical RCtc values to provide faster mutual-capacitance readout.

While embodiments described above are for projected capacitive touch sensors with horizontal and vertical electrodes on the same surface of the same glass (or polymer) layer, one skilled in the art will understand that balancing of horizontal and vertical values of RCtc also provide benefits for touch sensors with horizontal and vertical electrodes on different glass surfaces.

As described, varying the dimensions of the channels and links allows for the reduction in RCtc and matching of the RCtc associated with the horizontally and vertically arranged electrodes. This in turn facilitates faster acquisition of a touch location, which ultimately results in a more pleasant user experience.

Advantageously, the dimensions of channels and links may be optimized locally as well as globally within an electrode matrix of a touch sensor. Referring to FIG. 1, the channels and links have been optimized globally if all the links within electrode matrix 110 of touch sensor 100 have the same dimensions and all the channels within electrode matrix 110 have the same dimensions, and the values of the link and channel dimensions have been chosen to reduce or minimize the RCtc. In contrast, the channels and links have been optimized locally if within an electrode matrix of a touch sensor different channels and links have varying dimensions. By varying channel and link dimensions locally it is possible to further reduce RCtc.

Figure 5:
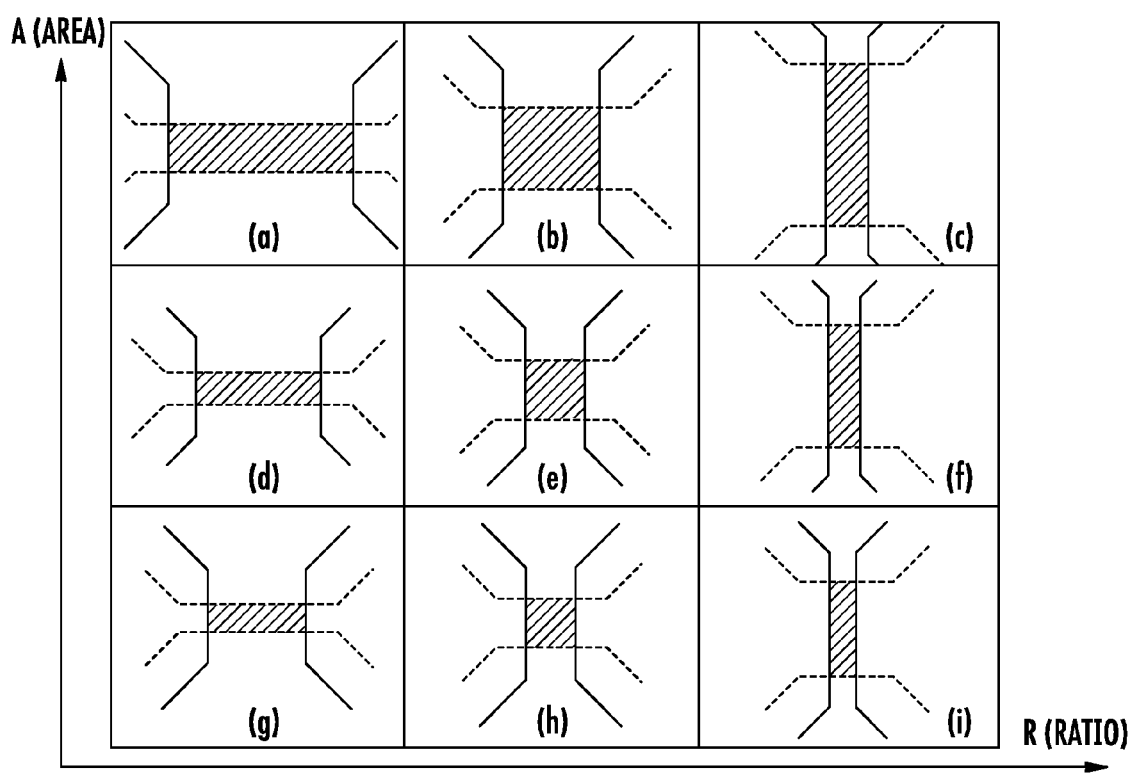
FIG. 5 illustrates channels and links of varying dimensions according to various embodiments.

FIG. 5 illustrates channels and links of varying dimensions. For simplicity of presentation, as well as to further illustrate the generality of this aspect of the invention, FIG. 5 illustrates channels of horizontal electrodes on the surface of a lower layer of glass separated from links between pads of vertical electrodes on an opposing surface of a separate upper layer of glass that is bonded to the lower layer of glass with an insulating and optically clear adhesive layer. In this case, beyond an optically clear adhesive, no additional insulators (such as insulators 310 of FIG. 3B) are needed to prevent electrical shorts between channels and links. Dashed lines outline the channels connecting pads of horizontal electrodes on the lower glass layer and solid lines outline the links connecting pads of vertical electrodes on the upper glass layer. In the plan view of FIG. 5, the shaded rectangles of squares indicate the area of overlap between the channel and link. Nine different examples of channel and link geometry are illustrated in (a) through (i) of FIG. 5. While FIG. 5 shows lower horizontal channels and upper vertical links, lower vertical channels and upper horizontal links is equally possible. As in the embodiment illustrated in FIGS. 3A, 3B, and 3C, it is possible to modify the structures of FIG. 5 so that pads of both horizontal and vertical electrodes are on the same substrate surface via addition of an insulator between channels and links.

From the left geometries (a), (d), and (g) to the right geometries (c), (f), and (i) of FIG. 5, the channel widens while the link narrows, that is the ratio R of channel width to link width increases while keeping the overlap area A fixed. From bottom geometries (g), (h), and (i) to top geometries (a), (b), and (c) the ratio R stays the same while the area A of overlap increases. For the middle column, from the large overlap area of geometry (b), to smaller overlap area of geometry (e), to the smallest overlap area of geometry (h), the stray capacitance associated with the overlap decreases as desired to reduce RCtc while unfortunately increasing the channel and link resistances. For the middle row, from small channel-width-to-link-width ratio of geometry (d), to equal channel and link widths of geometry (e), to large channel-width-to-link-width ratio of geometry (f), the channel resistance decreases as is desired to reduce RCtc while unfortunately the link resistance increases. An optimal trade-off may vary with position of the channels and links within the touch sensor. That is to say that it may be desirable to optimize locally rather than globally to provide the greatest reduction in RCtc.

As shown in FIG. 5, channels are of uniform width throughout their lengths and links are also of uniform width throughout their lengths. However, neither the channels nor links need necessarily be perfectly uniform in their widths along their lengths. More generally, the channel width may be defined as the average of the channel width over the length of the channel overlapping with the link. Similarly, the link width may be defined as the average of the link width over the length of the link overlapping with the channel. For clarity, channels and links are shown with uniform widths in the figures. Nevertheless, it is understood that links and channels need not be of uniform widths along their lengths.

Figure 6:
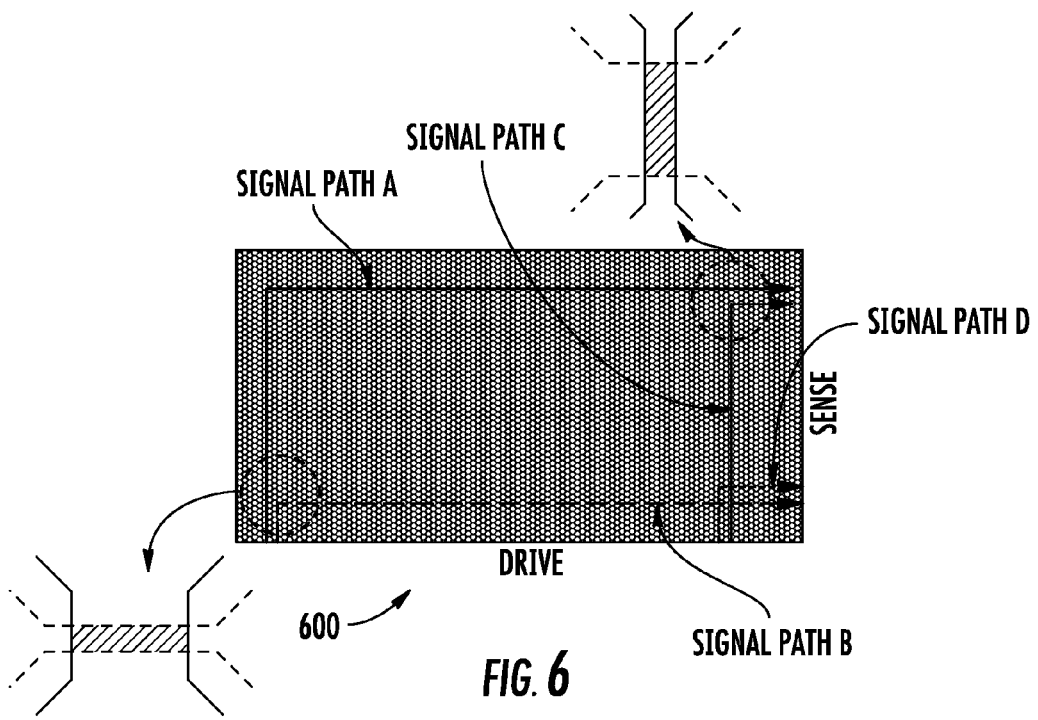
FIG. 6 illustrates a touch sensitive device with locally varying channel and link geometries according to various embodiments.

FIG. 6 illustrates a touch sensitive device 600 with locally varying channel and link geometries. Illustrated are four different signal paths from the drive electronics (schematically represented by the bottom gray rectangle labeled "Drive") to the sense electronics (schematically represented by the right gray rectangle labeled "Sense"). There is a general tendency for signals that travel greater distances through the RC network of the touchscreen to have longer RC time constants and for signals that travel shorter distances to be faster. For example, signals through path D tend to be faster, signals through paths B and C to be slower, and signals through the longest paths such as A to be slowest. In engineering practice, it is often desirable to improve the worst case, even at the expense of other cases. In particular, it improves overall system performance and user satisfaction to reduce RCtc for worst case signal path A even at the expense of somewhat increasing RCtc for other signal paths such as signal paths B and C.

As illustrated in the detail to the left of FIG. 6, touch sensitive device 600 uses a small channel-width-to-link-width ratio R (as in geometry (d) of FIG. 5) in the lower left region of the touch area. By increasing link widths and hence reducing link resistances in the vertical electrode of signal path A, RCtc for signal path A is reduced. This is at the expense of reducing channel widths and hence increasing channel resistances for the horizontal electrode of signal path B; this is acceptable because signal path B is not the worst case. In contrast, the touch sensitive device 600 uses a large channel-width-to-link-width ratio R (as in geometry (f) of FIG. 5) in the upper right region of the touch area. By increasing channel widths and hence reducing channel resistances in the horizontal electrode of signal path A, RCtc for signal path A is reduced. This is at the expense of reducing link widths and hence increasing link resistances for the vertical electrode of signal path C; again this may be acceptable because signal path C is not the worst case. Along the upper left to lower right diagonal, the channel-width-to-link-width ratio R is similar to that used to globally optimize channel and link dimensions for minimum RCtc.

Figure 7:
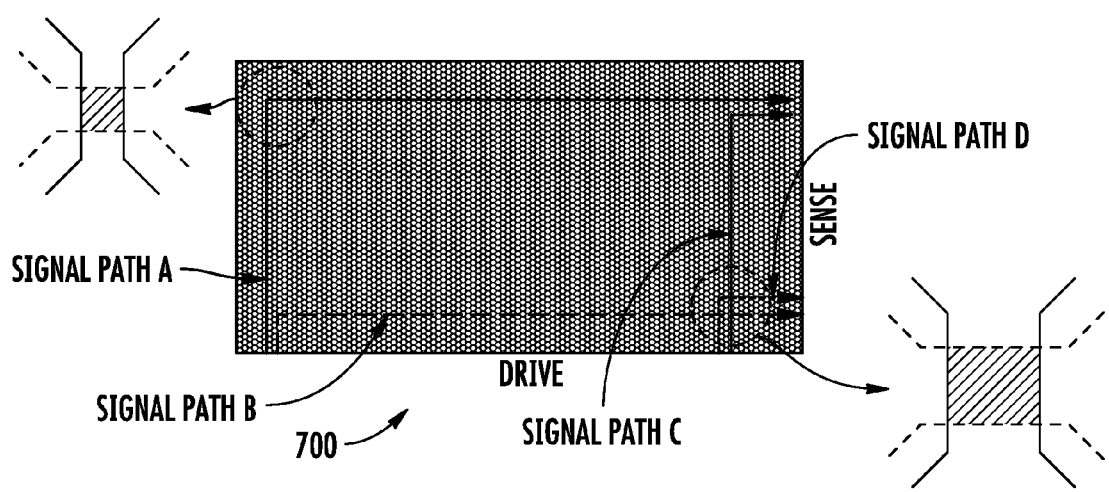
FIG. 7 illustrates a touch sensitive device with varied overlap area according to various embodiments.

In the touch sensitive device 700 of FIG. 7, it is not the channel-width-to-link-width ratio R that is varied locally, but rather the overlap area A. Touch sensitive device 700 is provided with drive and sense electronics similar to touch sensitive device 600 and is similarly represented in FIGS. 6 and 7. To reduce stray capacitances along the worst case signal path A, and hence reduce its RCtc, the overlap area A is reduced in the upper left portion of the touch area. Unfortunately, the reduced overlap area A results in increased resistance along the vertical and horizontal electrodes of signal path A. While not intuitively obvious, the inventors have discovered via simulation studies that the benefit of reduced stray capacitance in the upper left corner more than compensates for the effects of the increased resistance from smaller overlap area A, thus resulting in reduced RCtc for the worst case signal paths. Similarly, the inventors have discovered in the lower right corner, the benefits of reduced resistance from increased overlap area A more than compensates for the effects of increased stray capacitance. Thus, locally varying overlap areas that generally increase from the upper left corner to the lower right corner provide an additional means to reduce worst case RCtc.

While not explicitly shown in FIG. 6 or 7, it is understood that touch sensitive devices may be designed in which both the channel-width-to-link-width ratio R and the overlap area A are locally varied, providing further reduction in worst case RCtc.

The value of the channel-width-to-link-width ratio R and/or overlap area A may vary smoothly and continuously over the touch area. Alternatively the touch area may be partitioned into zones where within each zone the channel and link geometry is fixed. In either case, the local variation of channel and link geometry may be tuned and optimized in such a fashion to improve system performance by RCtc reduction.

While various embodiments have been described, it will be apparent to those of ordinary skill in the art that many more embodiments and implementations are possible that are within the scope of the claims. The various dimensions described above are merely exemplary and may be adjusted, for example, based upon the dimensions of the substrate, the number pads, the ratio of the number of pads in the different electrode orientations, the sheet material used for the conductive layers, etc. Accordingly, it will be apparent to those of ordinary skill in the art that many more embodiments and implementations are possible that are within the scope of the claims. Therefore, the embodiments described are only provided to aid in understanding the claims and do not limit the scope of the claims.

The invention claimed is:

1. A capacitive touch sensitive device, comprising:
   a matrix of pads patterned in a first electrically conductive material on a substrate or multiple substrates, wherein horizontally adjacent pads in even rows of the matrix are electrically coupled to one another via channels to form a plurality of horizontally arranged electrodes; and
   conductive links formed over respective channels configured to electrically couple vertically adjacent pads between odd rows of the matrix to form a plurality of vertically arranged electrodes,
   wherein dimensions of the channels and the conductive links are optimized locally by varying width ratios between widths of the channels and widths of their respective conductive links or overlap areas between the channels and their respective conductive links.

2. The capacitive touch sensitive device of claim 1, wherein the overlap areas between the channels and their respective conductive links are constant when the width ratios vary.

3. The capacitive touch sensitive device of claim 1, wherein the width ratios between widths of the channels and the widths of their respective conductive links are constant when the overlap areas vary.

4. The capacitive touch sensitive device of claim 1, wherein the plurality of horizontally arranged electrodes are disposed on a first surface of the substrate, and
wherein the plurality of vertically arranged electrodes are disposed on an opposing second surface of a second substrate.

5. The capacitive touch sensitive device of claim 1, further comprising:
one or more insulators positioned between the respective channels and their respective conductive links.

6. The capacitive touch sensitive device of claim 1, wherein dimensions of the channels and of the conductive links are configured to minimize time needed to sense a capacitance value associated with a first electrode of the plurality of horizontally arranged electrodes having a channel from among the channels and a second electrode of the plurality of vertically arranged electrodes having a conductive link from among the conductive links.

7. The capacitive touch sensitive device of claim 1, wherein a resistor-capacitor time constant of each of the vertically arranged electrodes and the horizontally arranged electrodes is less than 6.5 µs.

8. The capacitive touch sensitive device of claim 1, wherein a resistor-capacitor time constant (RCtc) of each of the vertically arranged electrodes is within ±50% of the RCtc of each of the horizontally arranged electrodes.

9. The capacitive touch sensitive device of claim 1, wherein a ratio of a total number of vertically arranged electrodes to a total number of horizontally arranged electrodes is approximately 16:9.

10. The capacitive touch sensitive device of claim 9, wherein each pad of the matrix is a diamond-shape pad and has an area of approximately 18 mm$^2$.

11. The capacitive touch sensitive device of claim 1, wherein the channels are patterned in a transparent conductive material with a sheet resistance of approximately 150 Ω/sq.

12. The capacitive touch sensitive device of claim 1, wherein the conductive links are formed from a transparent conductive material that has a sheet resistance of approximately 200 Ω/sq.

13. A method of manufacturing a capacitive touch sensitive device, comprising:
patterning a matrix of pads in a first electrically conductive material on a substrate or multiple substrates, wherein horizontally adjacent pads in even rows of the matrix are electrically coupled to one another via channels to form a plurality of horizontally arranged electrodes; and
forming conductive links over respective channels configured to electrically couple vertically adjacent pads between odd rows of the matrix to form a plurality of vertically arranged electrodes,
wherein dimensions of the channels and the conductive links are optimized locally by varying width ratios between widths of the channels and widths of their respective conductive links or overlap areas between the channels and their respective conductive links.

14. The method of claim 13, further comprising:
disposing the plurality of horizontally arranged electrodes on a first surface of the substrate; and
disposing the plurality of vertically arranged electrodes on an opposing second surface of a second substrate.

15. The method of claim 13, wherein the dimensions of the channels and the conductive links are configured to minimize time needed to sense a capacitance value associated with a first electrode of the plurality of horizontally arranged electrodes having a channel from among the channels and a second electrode of the plurality of vertically arranged electrodes having a conductive link from among the conductive links.

16. A capacitive touch sensitive device, comprising:
a matrix of pads patterned in a first electrically conductive material on a substrate or multiple substrates, wherein horizontally adjacent pads in even rows of the matrix are electrically coupled to one another via channels to form a plurality of horizontally arranged electrodes; and
conductive links formed over respective channels configured to electrically couple vertically adjacent pads between odd rows of the matrix to form a plurality of vertically arranged electrodes,
wherein at least one resistor-capacitor time constant (RCtc) of the matrix is different from at least one other RCtc of the matrix, and
wherein dimensions of the channels and the conductive links are optimized locally by varying width ratios between widths of the channels and widths of their respective conductive links or overlap areas between the channels and their respective conductive links.

\* \* \* \* \*

UNITED STATES PATENT AND TRADEMARK OFFICE
CERTIFICATE OF CORRECTION

PATENT NO. : 9,582,125 B2  
APPLICATION NO. : 14/395295  
DATED : February 28, 2017  
INVENTOR(S) : Son et al.

Page 1 of 1

It is certified that error appears in the above-identified patent and that said Letters Patent is hereby corrected as shown below:

In the Claims

In Column 11, Lines 13-14, replace "the respective channels" with --the channels--.

Signed and Sealed this
Twenty-ninth Day of May, 2018

Andrei Iancu
*Director of the United States Patent and Trademark Office*